US012720822B2

(12) United States Patent
Zhu et al.

(10) Patent No.: US 12,720,822 B2
(45) Date of Patent: Aug. 25, 2026

(54) INSULATED GATE BIPOLAR TRANSISTOR WITH AN ELECTRIC FIELD STOP LAYER AND PREPARATION METHOD THEREOF, AND ELECTRONIC DEVICE

(71) Applicant: BYD SEMICONDUCTOR COMPANY LIMITED, Shenzhen (CN)

(72) Inventors: Hui Zhu, Shenzhen (CN); Baowei Huang, Shenzhen (CN); Xiuguang Xiao, Shenzhen (CN)

(73) Assignee: BYD SEMICONDUCTOR COMPANY LIMITED, Shenzhen (CN)

( * ) Notice: Subject to any disclaimer, the term of this patent is extended or adjusted under 35 U.S.C. 154(b) by 801 days.

(21) Appl. No.: 17/953,822

(22) Filed: Sep. 27, 2022

(65) Prior Publication Data

US 2023/0015515 A1 Jan. 19, 2023

Related U.S. Application Data

(63) Continuation of application No. PCT/CN2021/082955, filed on Mar. 25, 2021.

(30) Foreign Application Priority Data

Mar. 31, 2020 (CN) ......................... 202010242481.2

(51) Int. Cl.
*H10D 62/13* (2025.01)
*H10D 12/00* (2025.01)
(Continued)

(52) U.S. Cl.
CPC ......... *H10D 62/142* (2025.01); *H10D 12/032* (2025.01); *H10D 12/441* (2025.01);
(Continued)

(58) Field of Classification Search
CPC .. H10D 62/142; H10D 12/032; H10D 12/441; H10D 12/481; H10D 62/112;
(Continued)

(56) References Cited

U.S. PATENT DOCUMENTS

2007/0120215 A1 5/2007 Yun et al.
2011/0101416 A1* 5/2011 Schulze ............... H10D 12/038 438/341
(Continued)

FOREIGN PATENT DOCUMENTS

CN 1469892 A 1/2004
CN 103594356 A 2/2014
(Continued)

OTHER PUBLICATIONS

The World Intellectual Property Organization (WIPO) International Search Report for PCT/CN2021/082955 Jun. 7, 2021 5 Pages.

*Primary Examiner* — Mohammad M Hoque
(74) *Attorney, Agent, or Firm* — Wenye Tan

(57) ABSTRACT

An insulated gate bipolar transistor and a preparation method thereof, and an electronic device. The insulated gate bipolar transistor includes: a drift region; an electrode structure on one side of the drift region; and an electric field stop layer arranged on one side of the drift region away from the electrode structure. The electric field stop layer includes a first sublayer and a second sublayer laminated together. The first sublayer is arranged close to the drift region. A junction depth of the first sublayer is greater than a junction depth of the second sublayer. A peak value of a doping concentration of the first sublayer is less than a peak value of a doping concentration of the second sublayer. A slope of a doping concentration curve of the first sublayer is less than a slope of a doping concentration curve of the second sublayer.

6 Claims, 5 Drawing Sheets

(51) Int. Cl.
*H10D 12/01* (2025.01)
*H10D 62/10* (2025.01)
*H10D 62/17* (2025.01)
*H10P 30/20* (2026.01)

(52) U.S. Cl.
CPC ......... *H10D 12/481* (2025.01); *H10D 62/112* (2025.01); *H10D 62/393* (2025.01); *H10P 30/204* (2026.01); *H10P 30/21* (2026.01)

(58) Field of Classification Search
CPC .... H10D 62/393; H10D 12/038; H10D 62/53; H10D 62/60; H10D 62/105; H10D 62/124; H10D 12/411; H01L 21/26513
USPC ........................................................... 257/143
See application file for complete search history.

(56) References Cited

U.S. PATENT DOCUMENTS

| | | | | |
|---|---|---|---|---|
| 2012/0267681 | A1 | 10/2012 | Nemoto et al. | |
| 2015/0287786 | A1* | 10/2015 | Jeon | H10D 62/393 438/138 |
| 2016/0300938 | A1 | 10/2016 | Tonari et al. | |
| 2017/0278929 | A1* | 9/2017 | Imagawa | H01L 21/26506 |
| 2018/0053655 | A1* | 2/2018 | Kawase | H10D 12/032 |

FOREIGN PATENT DOCUMENTS

| | | | | |
|---|---|---|---|---|
| CN | 103946983 | A | | 7/2014 |
| CN | 104979379 | A | * | 10/2015 |
| CN | 106463528 | A | | 2/2017 |
| CN | 109841518 | A | | 6/2019 |
| CN | 110137250 | A | | 8/2019 |
| CN | 115716896 | A | | 2/2023 |

* cited by examiner

INSULATED GATE BIPOLAR TRANSISTOR WITH AN ELECTRIC FIELD STOP LAYER AND PREPARATION METHOD THEREOF, AND ELECTRONIC DEVICE

CROSS-REFERENCE TO RELATED APPLICATION

The present disclosure is a continuation application of PCT application No. PCT/CN2021/082955 filed on Mar. 25, 2021, which claims priority to Chinese Patent Application No. 202010242481.2, filed on Mar. 31, 2020 and entitled "INSULATED GATE BIPOLAR TRANSISTOR AND PREPARATION METHOD THEREOF, AND ELECTRONIC DEVICE", the content of all of which is incorporated herein by reference in its entirety.

FIELD

The present disclosure relates to an insulated gate bipolar transistor and a preparation method thereof, and an electronic device.

BACKGROUND

With the rapid development of electric vehicles, the demand for insulated gate bipolar transistors (IGBTs) is also gradually increasing. Compared with non-punch-through IGBTs and punch-through IGBTs, field-stop IGBTs have the advantages of higher performance and lower costs. Compared with the non-punch-through IGBTs, the field-stop IGBTs introduce an electric field stop layer between the drift region and the collector. The introduction of the electric field stop layer enables the field-stop IGBT to terminate the electric field earlier while obtaining the same blocking ability. Therefore, the field-stop IGBTs are much thinner than the non-punch-through IGBTs and have better conduction and switching performance.

However, existing field-stop IGBTs and preparation method thereof, and electronic devices still need to be improved.

SUMMARY

According to one aspect of the present disclosure, the present disclosure provides an insulated gate bipolar transistor. The insulated gate bipolar transistor includes: a drift region; an electrode structure on one side of the drift region; and an electric field stop layer arranged on one side of the drift region away from the electrode structure. The electric field stop layer includes a first sublayer and a second sublayer laminated together. The first sublayer is arranged close to the drift region. A junction depth of the first sublayer is greater than a junction depth of the second sublayer. A peak value of a doping concentration of the first sublayer is less than a peak value of a doping concentration of the second sublayer. A slope of a doping concentration curve of the first sublayer is less than a slope of a doping concentration curve of the second sublayer. The doping concentration curve of the first sublayer and the doping concentration curve of the second sublayer are continuous. Therefore, the insulated gate bipolar transistor has at least one of the following advantages: higher switching softness; good reverse blocking ability; thinner thickness; lower turn-on loss, and lower switching loss; and lower costs.

According to another aspect of the present disclosure, the present disclosure provides a method for preparing an insulated gate bipolar transistor. The method includes: providing a float-zone silicon substrate, and forming an electrode structure on one side of the float-zone silicon substrate; and forming a drift region and an electric field stop layer in the float-zone silicon substrate.

The forming the drift region and the electric field stop layer in the float-zone silicon substrate includes:

forming the electric field stop layer on one side of the float-zone silicon substrate away from the electrode structure, and forming the drift region between the electrode structure and the electric field stop layer.

The forming the electric field stop layer on the side of the float-zone silicon substrate away from the electrode structure includes:

performing ion doping on the side of the float-zone silicon substrate away from the electrode structure to form a second sublayer, and performing proton doping on the side of the float-zone silicon substrate away from the electrode structure to form a first sublayer on one side of the second sublayer close to the electrode structure, so that a junction depth of the first sublayer is greater than a junction depth of the second sublayer, a peak value of a doping concentration of the first sublayer is less than a peak value of a doping concentration of the second sublayer, a slope of a doping concentration curve of the first sublayer is less than a slope of a doping concentration curve of the second sublayer, and the doping concentration curve of the first sublayer and the doping concentration curve of the second sublayer are continuous.

According to another aspect of the present disclosure, the present disclosure provides an electronic device. The electronic device includes the insulated gate bipolar transistor described above.

Additional aspects and advantages of the present disclosure will be given in the following description, some of which will become apparent from the following description or may be learned from practices of the present disclosure.

BRIEF DESCRIPTION OF THE DRAWINGS

The foregoing and/or additional aspects and advantages of the present disclosure will become apparent and comprehensible from the following descriptions of the embodiments with reference to the accompanying drawings, where.

DETAILED DESCRIPTION

The embodiments of the present disclosure are described below in detail. Examples of the embodiments are shown in the accompanying drawings, and same or similar reference signs in all the accompanying drawings indicate same or similar components or components having same or similar functions. The embodiments described below with reference to the accompanying drawings are exemplary and used only for explaining the present disclosure, and should not be construed as a limitation on the present disclosure.

Figure 1:
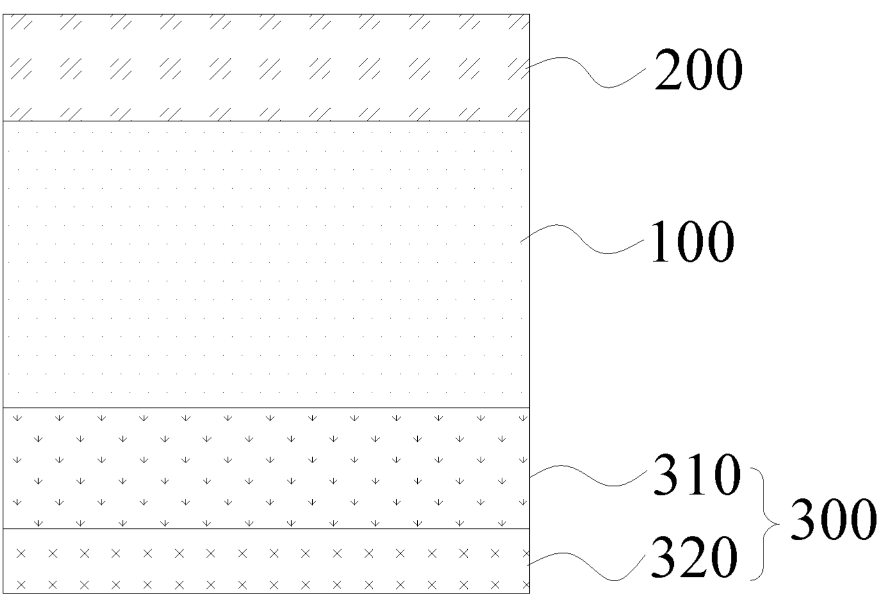
FIG. 1 is a schematic structural diagram of an insulated gate bipolar transistor according to an embodiment of the present disclosure.

According to one aspect of the present disclosure, the present disclosure provides an insulated gate bipolar transistor. According to an embodiment of the present disclosure, referring to FIG. 1, the insulated gate bipolar transistor includes: a drift region 100, an electrode structure 200, and an electric field stop layer 300. The electrode structure 200 is arranged on one side of the drift region 100. The electric field stop layer 300 is arranged on one side of the drift region 100 away from the electrode structure 200. The electric field stop layer 300 includes a first sublayer 310 and a second sublayer 320 laminated together. The first sublayer 310 is arranged close to the drift region 100. A junction depth of the first sublayer 310 is greater than a junction depth of the second sublayer 320. A peak value of a doping concentration of the first sublayer 310 is less than a peak value of a doping concentration of the second sublayer 320. A slope of a doping concentration curve of the first sublayer 310 is less than a slope of a doping concentration curve of the second sublayer 320. The doping concentration curve of the first sublayer 310 and the doping concentration curve of the second sublayer 320 are continuous. Therefore, the insulated gate bipolar transistor has at least one of the following advantages: higher switching softness; good reverse blocking ability; thinner thickness; lower turn-on loss, and lower switching loss; and lower costs.

Figure 5:
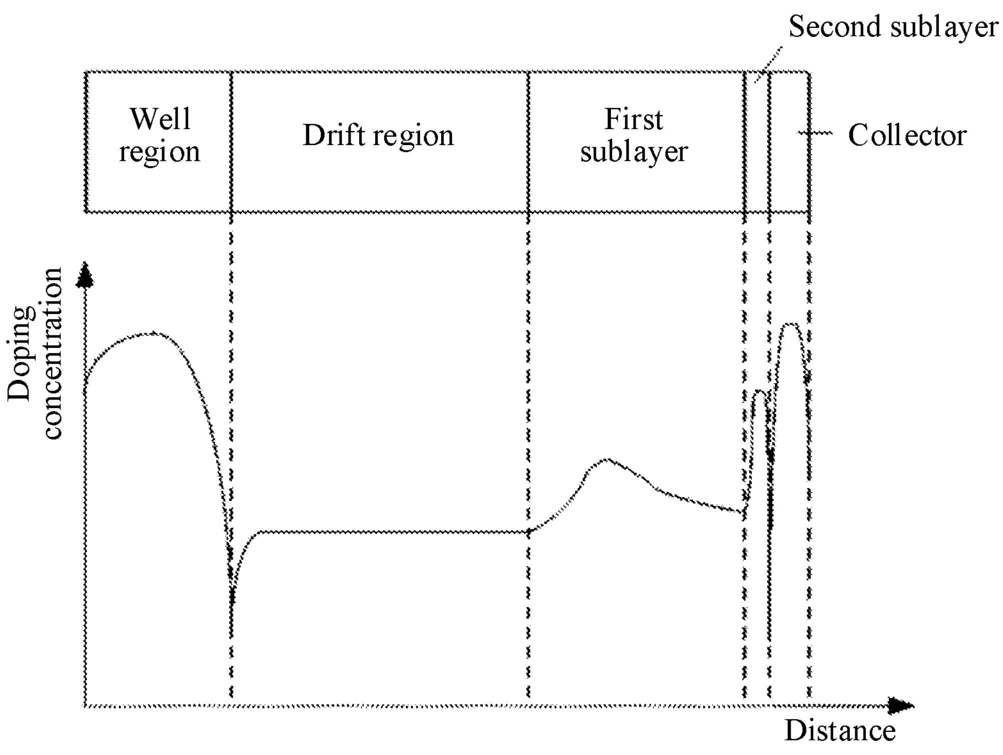
FIG. 5 is a diagram showing a dopant distribution in an electric field stop layer of an insulated gate bipolar transistor of Example 1.

In this embodiment, the doping concentration curve may reflect a relationship of a doping concentration of a dopant element changing with a doping distance. The doping concentration curve is introduced by taking the dopant distribution in the insulated gate bipolar transistor shown in FIG. 5 as an example, with the doping concentration as a vertical axis of the doping concentration curve and the distance as a horizontal axis of the doping concentration curve. The distance may be considered as a doping depth. As shown in FIG. 5, as the doping depth increases in a sequence of the well region, the drift region, the first sublayer, the second sublayer, and the collector of the transistor, the change in the concentration of the dopant element in different layers may be seen from the doping concentration curve.

For ease of understanding, the operation principle of the insulated gate bipolar transistor according to the embodiments of the present disclosure is first briefly described below.

According to the embodiments of the present disclosure, the structure of and the dopant distribution in the electric field stop layer are designed to provide the IGBT with good performance. Specifically, the electric field stop layer 300 includes a two-layer structure: the first sublayer 310 and the second sublayer 320 laminated together. The junction depth of the first sublayer 310 is greater than the junction depth of the second sublayer 320, and the peak value of the doping concentration of the first sublayer 310 is less than the peak value of the doping concentration of the second sublayer 320. That is, the first sublayer 310 has a dopant distribution with a great junction depth and low peak value, and the second sublayer 320 has a dopant distribution with a small junction depth and high peak value. The slope of the doping concentration curve of the first sublayer 310 is less than the slope of the doping concentration curve of the second sublayer 320. In other words, the doping concentration curve of the first sublayer has a higher degree of flatness than the doping concentration curve of the second sublayer (referring to FIG. 5). Therefore, the first sublayer 310 has a relatively flat and continuous dopant distribution, which can significantly improve the switching softness of the IGBT to provide the IGBT with a good switching waveform, and effectively alleviate the occurrence of high voltage and current spikes in the switching of the IGBT. In addition, because the peak value of the doping concentration of the second sublayer is higher than the peak value of the doping concentration of the first sublayer, i.e., the second sublayer has a higher doping peak, the IGBT has a good blocking ability during reverse blocking. Moreover, the small junction depth of the second sublayer is conducive to reducing the thickness of the IGBT, so that the IGBT has a lower turn-on loss and switching loss.

According to the embodiments of the present disclosure, the doping concentration curve of the first sublayer 310 and the doping concentration curve of the second sublayer 320 are continuous. That is, the dopant element at the junction between the first sublayer and the second sublayer is continuously distributed. At the junction between the first sublayer and the second sublayer, the doping concentration of the dopant element in the first sublayer is equal to the doping concentration of the dopant element in the second sublayer. Because the dopant element at the junction between the first sublayer and the second sublayer are continuously distributed (as shown in FIG. 5), the IGBT has good performance.

It should be noted that the doping concentration curve has apexes and troughs, where the apexes are critical points where the trend of the doping concentration changes from increasing to decreasing, and the troughs are critical points where the trend of the doping concentration changes from decreasing to increasing. The "peak value of the doping concentration" means an apex value on the doping concentration curve. It should be noted that the doping concentration in the present disclosure is measured in $cm^{-3}$.

The structures of the insulated gate bipolar transistor will be described below according to specific embodiments of the present disclosure:

According to an embodiment of the present disclosure, the junction depth of the first sublayer 310 is 10-100 times, e.g., 10 times, 20 times, 30 times, 40 times, 50 times, 60 times, 70 times, 80 times, 90 times, or 100 times, the junction depth of the second sublayer 320. The peak value of the doping concentration of the first sublayer 310 is on the order of $10^{14}$, and the peak value of the doping concentration of the second sublayer 320 is on the order of $10^{15}$-$10^{16}$. It is to be understood by those skilled in the art that the doping concentration of the drift region is generally on the order of $10^{13}$, the peak value of the doping concentration of the first sublayer 310 in the present disclosure is on the order of $10^{14}$, and the junction depth of the first sublayer 310 is relatively great. Therefore, a relatively flat and continuous dopant distribution in the first sublayer 310 can be obtained, which can significantly improve the switching softness of the IGBT to provide the IGBT with a good switching waveform, and effectively alleviate the occurrence of high voltage and current spikes in the switching of the IGBT. Because the peak value of the doping concentration of the second sublayer 320 is on the order of $10^{15}$-$10^{16}$, i.e., the second sublayer 320 has a higher doping peak, the IGBT has a good blocking ability during reverse blocking. Moreover, the small junction depth of the second sublayer is conducive to reducing the thickness of the IGBT, so that the IGBT has a lower turn-on loss and switching loss.

According to an embodiment of the present disclosure, provided that the junction depth of the first sublayer 310 is 10-100 times the junction depth of the second sublayer 320, the junction depth of the first sublayer 310 may be 20-40 μm, e.g., 20 μm, 25 μm, 30 μm, 35 μm, or 40 μm, and the junction depth of the second sublayer 320 may be 0.2-4 μm, e.g., 0.2 μm, 0.5 μm, 0.8 μm, 1 μm, 1.5 μm, 2 μm, 2.5 μm, 3 μm, 3.5 μm, or 4 μm. Therefore, the IGBT can have higher softness and good turn-off performance.

According to the embodiments of the present disclosure, by designing the junction depths and the peak values of the doping concentrations of the first sublayer and the second sublayer according to the above conditions, the doping concentration of the dopant element per unit thickness of the second sublayer may be made 5-10 times the doping concentration of the dopant element per unit thickness of the first sublayer. In other words, referring to FIG. 5, the slope of the doping concentration curve of the second sublayer is 5-10 times the slope of the doping concentration curve of the first sublayer, so that the doping concentration curve of the first sublayer has a higher flatness than the doping concentration curve of the second sublayer, which makes the IGBT have high turn-off softness and good reverse blocking ability at the same time.

According to an embodiment of the present disclosure, the first sublayer 310 may be formed by proton implantation, the second sublayer 320 may be formed by ion implantation, and the first sublayer 310 may be formed later than the second sublayer 320. Therefore, the first sublayer formed by proton implantation may have a greater junction depth and a lower doping peak, the second sublayer formed by ion implantation may have a higher doping peak, and the second sublayer is formed earlier than the first sublayer, so that the first sublayer can obtain a flatter and continuous dopant distribution (compared to sublayers formed directly by proton implantation in the related art, the first sublayer formed by the method of this embodiment has a flatter distribution of the dopant element). The first sublayer having the flat and continuous dopant distribution can effectively improve the turn-on and turn-off performance and softness of the IGBT, so that the IGBT has a good switching waveform, thereby effectively alleviating the occurrence of high voltage and current spikes in the switching of the IGBT. The second sublayer having the high doping peak enables the IGBT to have a good reverse blocking ability and thinner thickness.

The inventors have found that if proton implantation is performed first to form the first sublayer and then ion implantation is performed to form the second sublayer, the distribution of the dopant element at the interface between the first sublayer and the second sublayer will be discontinuous, affecting the performance of the IGBT.

According to an embodiment of the present disclosure, the doping concentration of the first sublayer 310 has no more than two peak values. In this way, a relatively flat and continuous dopant distribution in the first sublayer can be obtained through a small number of implantations, so that the number of proton implantations can be effectively reduced, thereby solving the problems such as low productivity, high costs, and radiation control caused by excessive proton implantations (more than three times of implantation). Because a relatively flat and continuous dopant distribution in the first sublayer can be obtained through a small number of implantations, the costs of the IGBT are significantly reduced.

The specific number of peak values of the doping concentration in the first sublayer is not particularly limited, and may be designed by those skilled in the art according to an actual environment where the IGBT is to be applied. For example, according to an embodiment of the present disclosure, when the IGBT is applied to a medium- or low-voltage device, the number of peak values of the doping concentration in the first sublayer 310 may be one; when the IGBT is applied to a high-voltage device, the number of peak values of the doping concentration in the first sublayer 310 may be two. Therefore, the IGBT of the present disclosure may not be limited by the device usage environment, i.e., the IGBT of the present disclosure may be suitable for use in medium- or low-voltage devices, may also be suitable for use in high-voltage devices, and has good switching performance.

According to an embodiment of the present disclosure, the electric field stop layer 300 may be formed of float-zone silicon. The float-zone silicon has fewer defects, and the doping concentration of the float-zone silicon is easy to control, which can further improve the switching performance of the IGBT.

Figure 2:
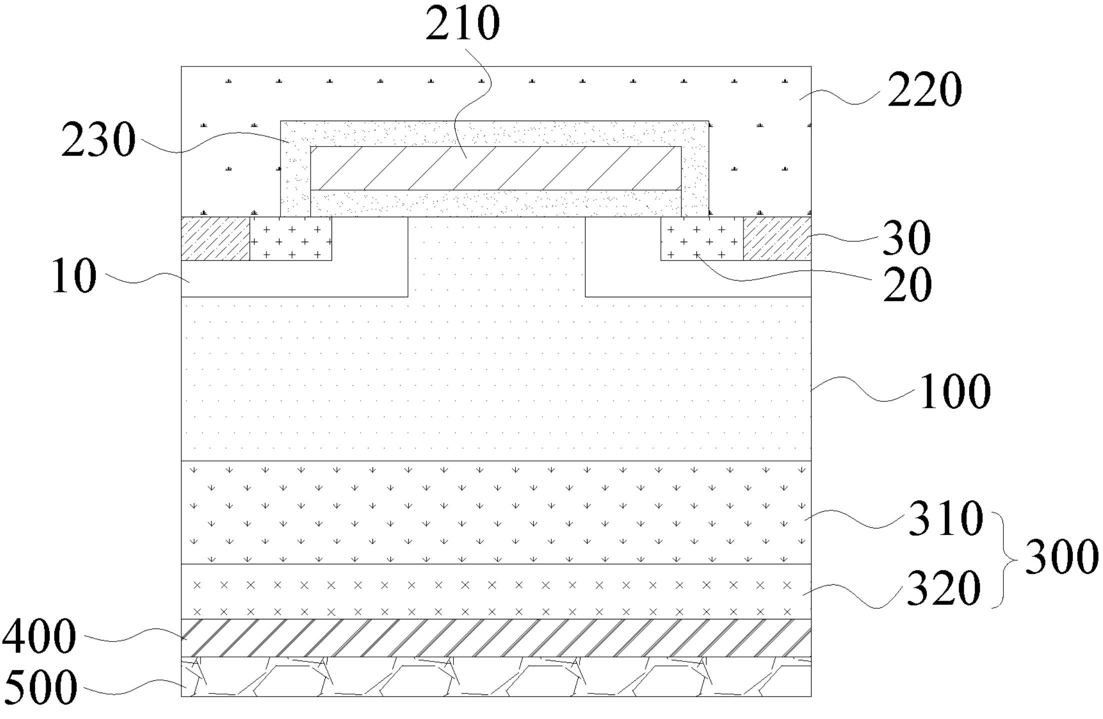
FIG. 2 is a schematic structural diagram of an insulated gate bipolar transistor according to another embodiment of the present disclosure.
Figure 3:
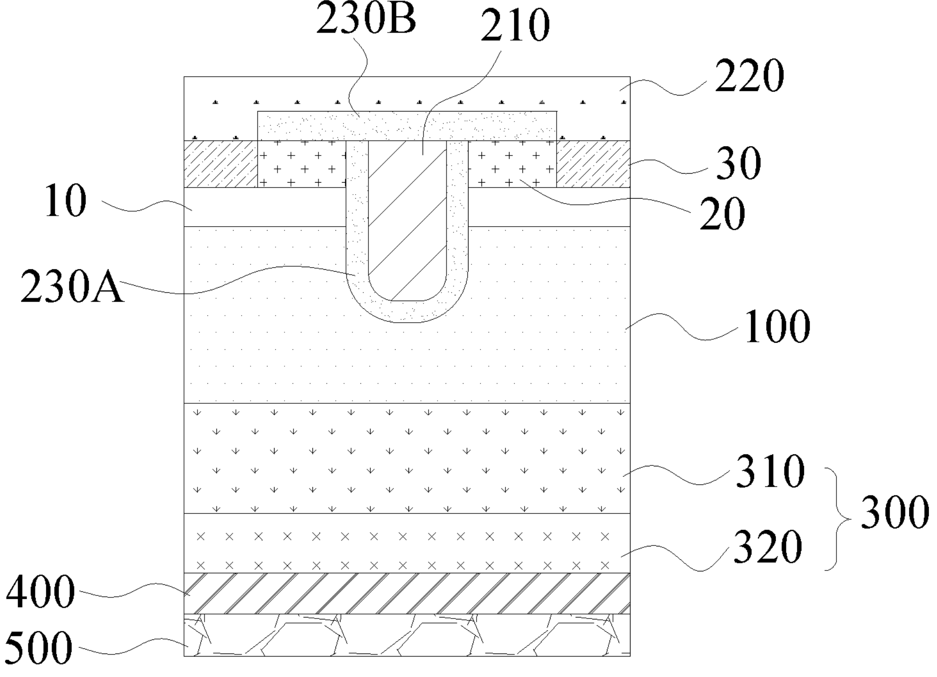
FIG. 3 is a schematic structural diagram of an insulated gate bipolar transistor according to another embodiment of the present disclosure.

According to an embodiment of the present disclosure, referring to FIG. 2 and FIG. 3, the drift region 100 may have N-type doping, and the electrode structure 200 includes: a well region 10, a source region 20, a contact region 30, a gate 210, a first metal layer 220, and an insulating layer 230. The well region 10 is arranged in the drift region 100. The well region 10 has P-type doping. The source region 20 and the contact region 30 are arranged in the well region 10. The source region 20 has N-type doping. The contact region 30 has P-type doping. The specific structure of the gate is not particularly limited, and may be designed by those skilled in the art according to specific situations.

For example, according to an embodiment of the present disclosure, referring to FIG. 2, the drift region has N-type doping, a protruding portion is arranged on one side of the drift region away from the electric field stop layer, and a recessed portion is formed on an outer side of the protruding portion. The well region is arranged in the recessed portion, and the source region and the contact region are arranged in the well region. The gate 210 may be a planar gate structure. The gate 210 is arranged on the side of the drift region 100 away from the electric field stop layer 300. To be specific, the gate 210 is arranged on one side of the protruding portion of the drift region 100 away from the electric field stop layer 300. The first metal layer 220 covers the gate 210, the source region 20, and the contact region 30. An insulating layer 230 is arranged between the first metal layer 220 and the gate 210 and between the gate 210 and the drift region 100.

Alternatively, referring to FIG. 3, the gate 210 may be a trench gate structure, a groove is provided on the side of the drift region 100 away from the electric field stop layer 300, and the gate 210 is arranged on the side of the drift region 100 away from the electric field stop layer 300 and extends into the groove. The well region 10 is arranged on the side of the drift region 100 away from the electric field stop layer 300 and is arranged around the gate 210. The source region 20 is arranged on one side of the well region 10 away from the drift region 100 and is arranged around the gate 210. The contact region 30 is arranged on the side of the well region 10 away from the drift region 100 and is arranged on an outer side of the source region 20. In addition, an insulating layer 230A is arranged in the groove of the drift region 100. The insulating layer 230A is located between the gate 210 and the drift region 100. An insulating layer 230B is arranged on a surface of the drift region 100 away from the electric field stop layer 300. The first metal layer 220 covers the insulating layer 230B, the source region 20, and the contact region 30. Therefore, the IGBT has good performance, and the IGBT has a wide application range.

According to an embodiment of the present disclosure, referring to FIG. 2 and FIG. 3, the IGBT may further include: a collector 400 and a second metal layer 500. The collector 400 is arranged on one side of the electric field stop layer 300 away from the drift region 100. The second metal layer 500 is arranged on one side of the collector 400 away from the electric field stop layer 300. Therefore, the IGBT can have good usage performance.

According to an embodiment of the present disclosure, the collector 400 and the second sublayer 320 may be formed by the same annealing treatment. To be specific, After N-type dopant ions are implanted, P-type dopant ions are implanted, and then annealing treatment is performed, to form the second sublayer 320 in the region where the N-type dopant ions are implanted and form the collector 400 in the region where the P-type dopant ions are implanted. Therefore, the preparation process can be simplified.

According to another aspect of the present disclosure, the present disclosure provides a method for preparing an insulated gate bipolar transistor. According to an embodiment of the present disclosure, the insulated gate bipolar transistor prepared by this method may be the insulated gate bipolar transistor described above. Therefore, the insulated gate bipolar transistor prepared by this method has the same features and advantages as those of the insulated gate bipolar transistor described above, which will not be repeated here.

Figure 4:
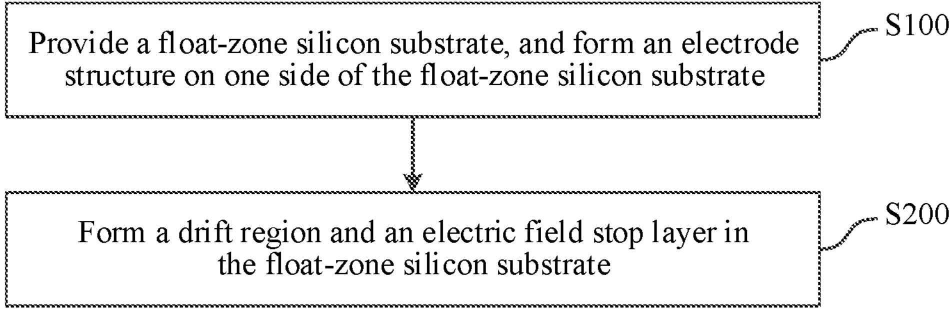
FIG. 4 is a schematic flowchart of a method for preparing an insulated gate bipolar transistor according to an embodiment of the present disclosure.

According to an embodiment of the present disclosure, referring to FIG. 4, the method includes the following steps.

S100: A float-zone silicon substrate is provided, and an electrode structure is formed on one side of the float-zone silicon substrate.

According to an embodiment of the present disclosure, in this step, the float-zone silicon substrate is provided, and the float-zone silicon substrate has N-type doping. Because the float-zone silicon has fewer defects and the doping concentration of the float-zone silicon is easy to control, the use of the float-zone silicon as the substrate helps improve the switching performance of the IGBT. The specific type of the float-zone silicon substrate is not particularly limited, and a float-zone silicon substrate with suitable resistivity specifications may be selected by those skilled in the art according to actual product requirements.

In this embodiment, the electrode structure includes a well region, a source region, a contact region, a gate, an insulating layer, and a first metal layer. The forming the electrode structure on the side of the float-zone silicon substrate may include: performing ion doping on the side of the float-zone silicon substrate to form the well region, the source region, and the contact region. The forming the electrode structure on the side of the float-zone silicon substrate may further include: performing deposition treatment and patterning treatment on the side of the float-zone silicon substrate to form the gate, the insulating layer, and the first metal layer. The gate may be a planar gate structure or a trench gate structure.

In a specific implementation, the formation process of forming the electrode structure on the side of the float-zone silicon substrate includes: first, implanting P-type dopant ions into a predetermined region of the float-zone silicon substrate to form the well region; then, implanting N-type dopant ions into a predetermined region of the well region to form the source region; and finally, implanting P-type dopant ions into a predetermined region of the well region to form the contact region. Afterward, the gate, the insulating layer, and the first metal layer are formed on a side surface of the float-zone silicon substrate where the well region is arranged.

Exemplarily, when the gate is a planar gate structure, the process of forming the gate, the insulating layer, and the first metal layer is as follows: First, an insulating material is deposited on one side of the float-zone silicon substrate where the well region is arranged, followed by patterning treatment to form a first insulating layer. Then, a metal material is deposited on one side of the first insulating layer away from the float-zone silicon substrate, followed by patterning treatment to form the gate. Afterward, an insulating material is deposited on one side of the gate away from the first insulating layer, followed by patterning treatment to form a second insulating layer. Finally, a metal material is deposited on one side of the second insulating layer away from the gate, followed by patterning treatment to form the first metal layer. The first metal layer covers the gate, the contact region, and the source region.

Exemplarily, when the gate is a trench gate structure, the process of forming the gate, the insulating layer, and the first metal layer is as follows: First, patterning treatment is performed on the float-zone silicon substrate to form a groove on one side of the float-zone silicon substrate, i.e., a groove is formed on one side used for preparing the electrode structure. Then, an insulating material is deposited in the groove, followed by patterning treatment to form a first insulating layer, where the first insulating layer is also of a groove shape. Afterward, a metal material is deposited in the groove of the first insulating layer, followed by patterning treatment to form the gate. Finally, a second insulating layer and the first metal layer are sequentially formed on one side of the gate away from the float-zone silicon substrate. The first metal layer covers the gate, the contact region, and the source region.

The materials of the insulating layer, the gate, and the first metal layer are not particularly limited, and may be designed by those skilled in the art according to materials commonly used by the above layers in the IGBT. It should be noted that the patterning treatment of different layers may be etching the materials of different layers based on the materials of different layers, to form layers of predetermined shapes.

According to an embodiment of the present disclosure, after the electrode structure is formed, a protective film is arranged on one side of the first metal layer away from the gate, thereby avoiding adverse effects on the electrode structure during subsequent preparation of the electric field stop layer.

S200: A drift region and an electric field stop layer are formed in the float-zone silicon substrate.

In a specific implementation, this step may further include: forming the electric field stop layer on one side of the float-zone silicon substrate away from the electrode structure, and forming the drift region between the electrode structure and the electric field stop layer. In this step, the electric field stop layer may be formed by the following steps: The forming the electric field stop layer on the side of the float-zone silicon substrate away from the electrode structure includes: performing ion doping on the side of the float-zone silicon substrate away from the electrode structure to form a second sublayer, and performing proton doping on the side of the float-zone silicon substrate away from the electrode structure to form a first sublayer on one side of the second sublayer close to the electrode structure, thus forming the electric field stop layer. The drift region may be formed by the following steps: after the electrode structure is formed on one side of the float-zone silicon substrate and the electric field stop layer is formed on the other side of the float-zone silicon substrate, the float-zone silicon substrate between the electrode structure and the electric field stop layer forms the drift region, where the drift region has N-type doping.

According to an embodiment of the present disclosure, the drift region is arranged on one side of the float-zone silicon substrate close to the electrode structure. The electric field stop layer includes a first sublayer and a second sublayer laminated together. The first sublayer is arranged close to the drift region. A junction depth of the first sublayer is greater than a junction depth of the second sublayer. A peak value of a doping concentration of the first sublayer is less than a peak value of a doping concentration of the second sublayer. A slope of a doping concentration curve of the first sublayer is less than a slope of a doping concentration curve of the second sublayer. The doping concentration curve of the first sublayer and the doping concentration curve of the second sublayer are continuous. Therefore, the IGBT can have higher switching softness, good reverse blocking ability, thinner thickness, lower turn-on loss, lower switching loss, and lower costs.

According to an embodiment of the present disclosure, the junction depth of the first sublayer is 10-100 times the junction depth of the second sublayer, the peak value of the doping concentration of the first sublayer is on the order of $10^{14}$, and the peak value of the doping concentration of the second sublayer is on the order of $10^{15}$-$10^{16}$. Therefore, a flat and continuous distribution of the dopant element in the first sublayer can be obtained, which can significantly improve the switching softness of the IGBT to provide the IGBT with a good switching waveform, and effectively alleviate the occurrence of high voltage and current spikes in the switching of the IGBT. In addition, the second sublayer has a higher doping peak, the IGBT has a good blocking ability during reverse blocking. Moreover, the small junction depth of the second sublayer is conducive to reducing the thickness of the IGBT, so that the IGBT has a lower turn-on loss and switching loss.

According to an embodiment of the present disclosure, the side of the float-zone silicon substrate away from the electrode structure is thinned, so that the float-zone silicon substrate has a suitable thickness. The thickness of the float-zone silicon substrate after thinning is not particularly limited, and may be designed by those skilled in the art according to actual product requirements.

According to an embodiment of the present disclosure, before the electric field stop layer is formed in the float-zone silicon substrate, the float-zone silicon substrate is cleaned and dried in advance to provide a clean surface for the preparation of the electric field stop layer.

In one embodiment, the first sublayer and the second sublayer may be formed by the following steps: first, implanting N-type dopant ions at the side of the float-zone silicon substrate away from the electrode structure, and performing a first annealing treatment to form the second sublayer; and then, performing proton implantation at the side of the float-zone silicon substrate away from the electrode structure, and performing a second annealing treatment to form the first sublayer on the side of the second sublayer close to the electrode structure. The first sublayer is formed later than the second sublayer in the present disclosure. The second sublayer already exists at a shallow depth of the side of the float-zone silicon substrate away from the electrode structure before the first sublayer is formed, and lattices at the shallow depth are redistributed by the first annealing treatment, so that the proton implantation in the process of forming the first sublayer has a larger scattering coefficient. Therefore, a relatively flat and continuous dopant distribution in the first sublayer can be obtained through a small number of implantations. The first sublayer having the flat and continuous distribution can improve the switching softness of the IGBT in the switching of the IGBT, to provide the IGBT with a good switching waveform and prevent the occurrence of high voltage and current spikes in the switching. In addition, because the second sublayer is formed by ion implantation and the first annealing treatment, the second sublayer has a higher doping peak, so that the IGBT has a good reverse blocking ability. Moreover, the thickness of the IGBT can be further reduced, so that the IGBT has a lower turn-on loss and switching loss. Furthermore, the ion implantation process is simple and can further reduce the costs of the IGBT.

According to an embodiment of the present disclosure, the number of times of proton implantation does not exceed two during the formation of the first sublayer, so the number of peak values of the doping concentration of the first sublayer does not exceed two. In this way, a first sublayer having a flat and continuous doping distribution can be obtained through a small number of proton implantations, and then an electric field stop layer having good switching performance can be obtained, thereby solving the problems such as low productivity, high costs, and radiation control caused by excessive proton implantations (more than three times of implantation), and significantly reducing the production costs of the IGBT.

The specific composition of the N-type dopant ions is not particularly limited. For example, according to an embodiment of the present disclosure, the N-type dopant ions may be phosphorus ions.

The specific method and specific process parameters of the first annealing treatment are not particularly limited, and may be designed by those skilled in the art according to annealing methods and procedures commonly used in ion implantation. For example, phosphorous implanted in the float-zone silicon substrate may be activated by laser annealing to form the second sublayer.

The specific method and specific process parameters of the second annealing treatment are not particularly limited, and may be designed by those skilled in the art according to annealing methods and procedures commonly used in proton implantation. For example, donor doping may be formed through activation by annealing in a high vacuum furnace.

It should be noted that after the proton implantation and before the second annealing treatment, the protective film arranged on the electrode structure is removed in advance. Since the protective film is not resistant to high temperature, removing the protective film before the second annealing treatment can prevent adverse effects of the protective film at high temperature on the electrode structure.

In one embodiment, in order to simplify the process, a collector may be formed simultaneously with the formation of the second sublayer. In this embodiment, the second sublayer and the collector may be formed by the following steps: implanting the N-type dopant ions at the side of the float-zone silicon substrate away from the electrode structure; after implanting the N-type dopant ions, implanting P-type dopant ions at the side of the float-zone silicon substrate away from the electrode structure; and after implanting the P-type dopant ions, performing the first annealing treatment to form the second sublayer and a collector on one side of the second sublayer away from the electrode structure. In this embodiment, the first annealing treatment is performed after the N-type dopant ions and the P-type dopant ions are implanted, so that the implanted N-type dopant ions and P-type dopant ions may be activated at the same time, so as to form the second sublayer in the region where the N-type dopant ions are implanted and form the collector in the region where the P-type doped ions are implanted. Therefore, the formation of the second sublayer and the collector can share the same annealing treatment, thereby simplifying the production process. In addition, in the subsequent proton implantation process, because the second sublayer and the collector already exist at the shallow depth of the side of the float-zone silicon substrate away from the electrode structure before the first sublayer is formed, and lattices at the shallow depth are redistributed by the first annealing treatment, the scattering coefficient during proton implantation can be further increased, thereby further improving the flatness of the dopant distribution in the first sublayer and further improving the switching performance of the IGBT.

It should be noted that, ion doping may also be performed at one side of the second sublayer away from the electrode structure after the first sublayer and the second sublayer are formed, to form the collector on the side of the second sublayer away from the electrode structure.

The specific composition of the P-type dopant ions is not particularly limited. For example, according to an embodiment of the present disclosure, the P-type dopant ions may be boron ions.

According to an embodiment of the present disclosure, the method may further include: forming a second metal layer on one side of the collector away from the electrode structure. Therefore, the IGBT can have good usage performance. The preparation method of the second metal layer is not particularly limited. For example, the second metal layer may be formed by sputtering or evaporation.

According to another aspect of the present disclosure, the present disclosure provides an electronic device. The electronic device includes the insulated gate bipolar transistor described above. Therefore, the electronic device has all the features and advantages of the insulated gate bipolar transistor described above, which will not be repeated here. In general, the electronic device has good usage performance.

The solutions of the present disclosure will be described below through specific examples. It should be noted that the following examples are only used to illustrate the present disclosure, and should not be construed as limiting the scope of the present disclosure. Where no specific technologies or conditions are indicated in the embodiments, the technologies or conditions described in the literatures in the art or the instructions for the product are followed.

Example 1

The IGBT includes an electrode structure, a drift region, an electric field stop layer, a collector, and a second metal layer that are laminated in sequence. The electric field stop layer includes a first sublayer and a second sublayer laminated together. The first sublayer is arranged close to the drift region. A junction depth of the first sublayer is greater than a junction depth of the second sublayer. A peak value of a doping concentration of the first sublayer is less than a peak value of a doping concentration of the second sublayer. The junction depth of the first sublayer is 30 The junction depth of the second sublayer is 2 The peak value of the doping concentration of the first sublayer is $6\times10^{14}$. The peak value of the doping concentration of the first sublayer is 1. The peak value of the doping concentration of the second sublayer is $5\times10^{15}$. A dopant element at the junction between the first sublayer and the second sublayer is continuously distributed.

The first sublayer is formed by proton implantation, the second sublayer is formed by ion implantation, and the first sublayer is formed later than the second sublayer.

A dopant distribution in the electric field stop layer of the IGBT in this embodiment is shown in FIG. 5. It can be seen from FIG. 5 that the distribution of the dopant element in the first sublayer is flat, and the distribution of the dopant element in the second sublayer is steep.

Comparative Example 1

The IGBT of this comparative example is the same as that of Example 1, except that the electric field stop layer is a one-layer structure and is formed by ion implantation, the junction depth of the electric field stop layer is 2 μm, and the peak value of the doping concentration in the electric field stop layer is $8\times10^{15}$.

Figure 6:
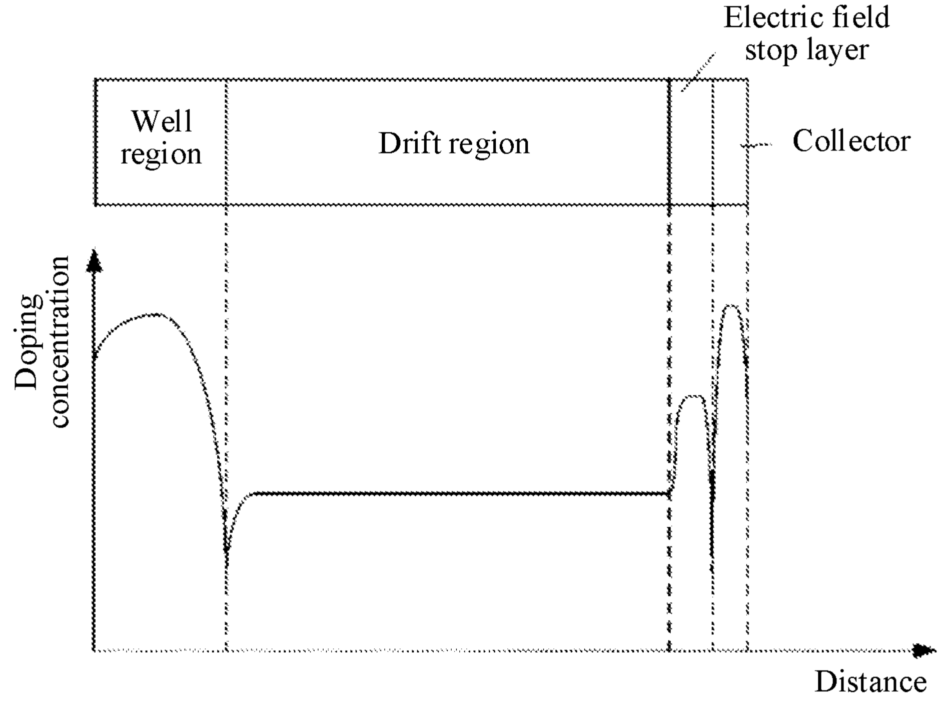
FIG. 6 is a diagram showing a dopant distribution in an electric field stop layer of an insulated gate bipolar transistor of Comparative Example 1.

A dopant distribution in the electric field stop layer of the IGBT in this comparative example is shown in FIG. 6.

Comparative Example 2

The IGBT of this comparative example is the same as that of Example 1, except that the electric field stop layer is a one-layer structure and is formed by proton implantation, the junction depth of the electric field stop layer is 40 μm, a maximum value among the peak values of the doping concentration in the electric field stop layer is $6\times10^{14}$, and the doping concentration in the electric field stop layer has four peak values.

Figure 7:
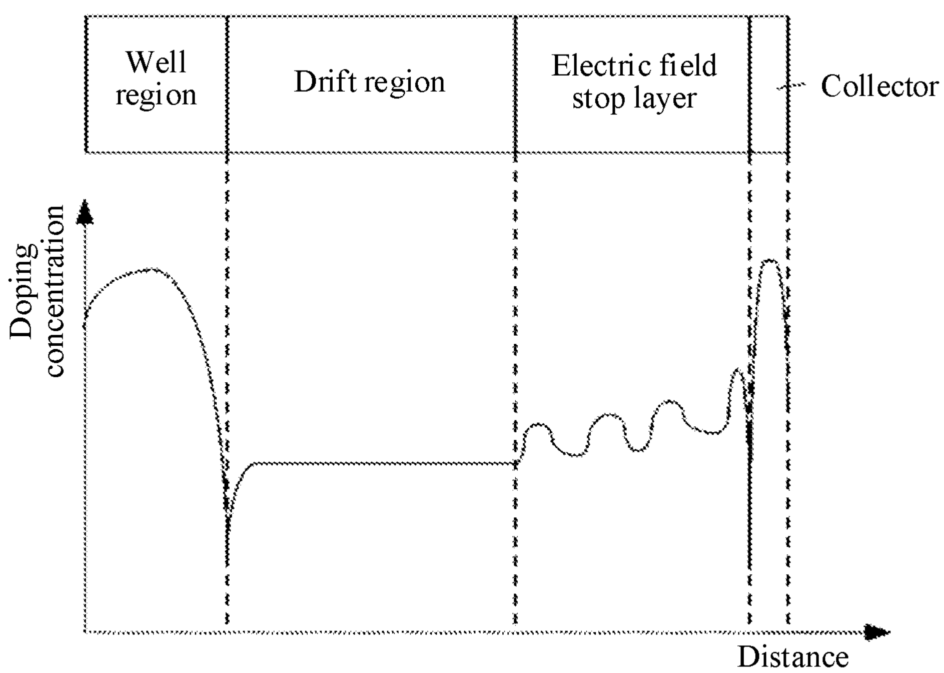
FIG. 7 is a diagram showing a dopant distribution in an electric field stop layer of an insulated gate bipolar transistor of Comparative Example 2.

A dopant distribution in the electric field stop layer of the IGBT in this comparative example is shown in FIG. 7.

Comparative Example 3

The IGBT of this comparative example is the same as that of Example 1, except that the electric field stop layer includes a first sublayer and a second sublayer laminated together, the first sublayer is arranged close to the drift region, the first sublayer and the second sublayer are both formed by ion implantation, the junction depth of the first sublayer is 2 μm, the junction depth of the second sublayer is 0.5 μm, the peak value of the doping concentration of the first sublayer is $8\times10^{14}$, and the peak value of the doping concentration of the second sublayer is $5\times10^{15}$.

Figure 8:
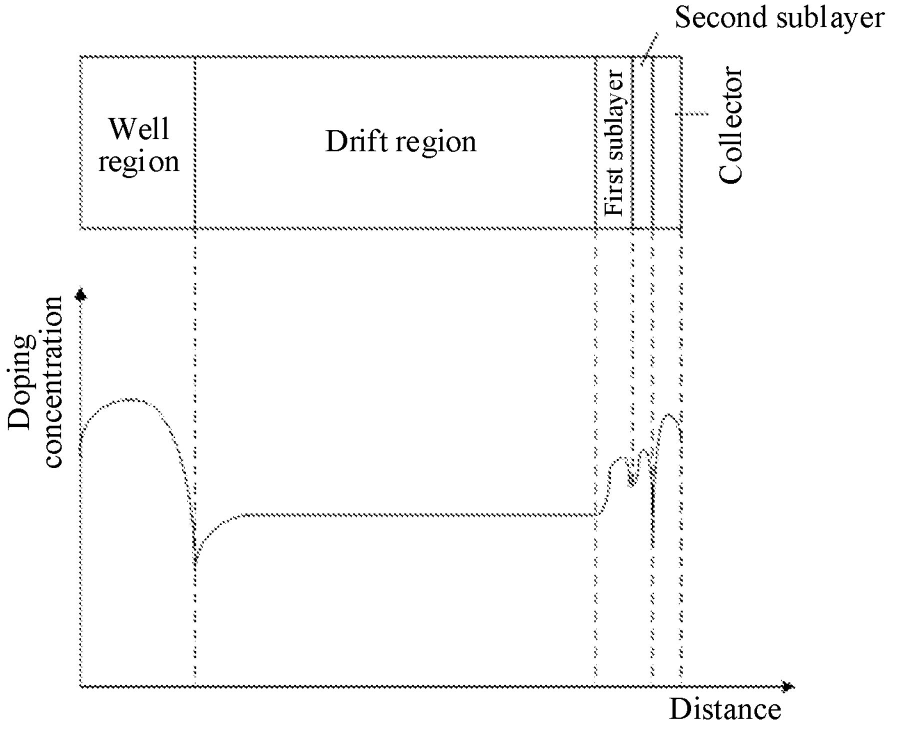
FIG. 8 is a diagram showing a dopant distribution in an electric field stop layer of an insulated gate bipolar transistor of Comparative Example 3.

A dopant distribution in the electric field stop layer of the IGBT in this comparative example is shown in FIG. 8. It can be seen from FIG. 8 that the distributions of the dopant element in the two sublayers are both steep and are relatively similar.

Comparative Example 4

The IGBT of this comparative example is the same as that of Example 1, except that the electric field stop layer includes a first sublayer and a second sublayer laminated together, the first sublayer is arranged close to the drift region, the first sublayer is formed by proton implantation, the second sublayer is formed by ion implantation, the first sublayer is first formed by one proton implantation and then the second sublayer is formed by ion implantation, the junction depth of the first sublayer is 30 μm, the junction depth of the second sublayer is 2 μm, the peak value of the doping concentration of the first sublayer is $4\times10^{14}$, and the peak value of the doping concentration of the second sublayer is $5\times10^{15}$.

Figure 9:
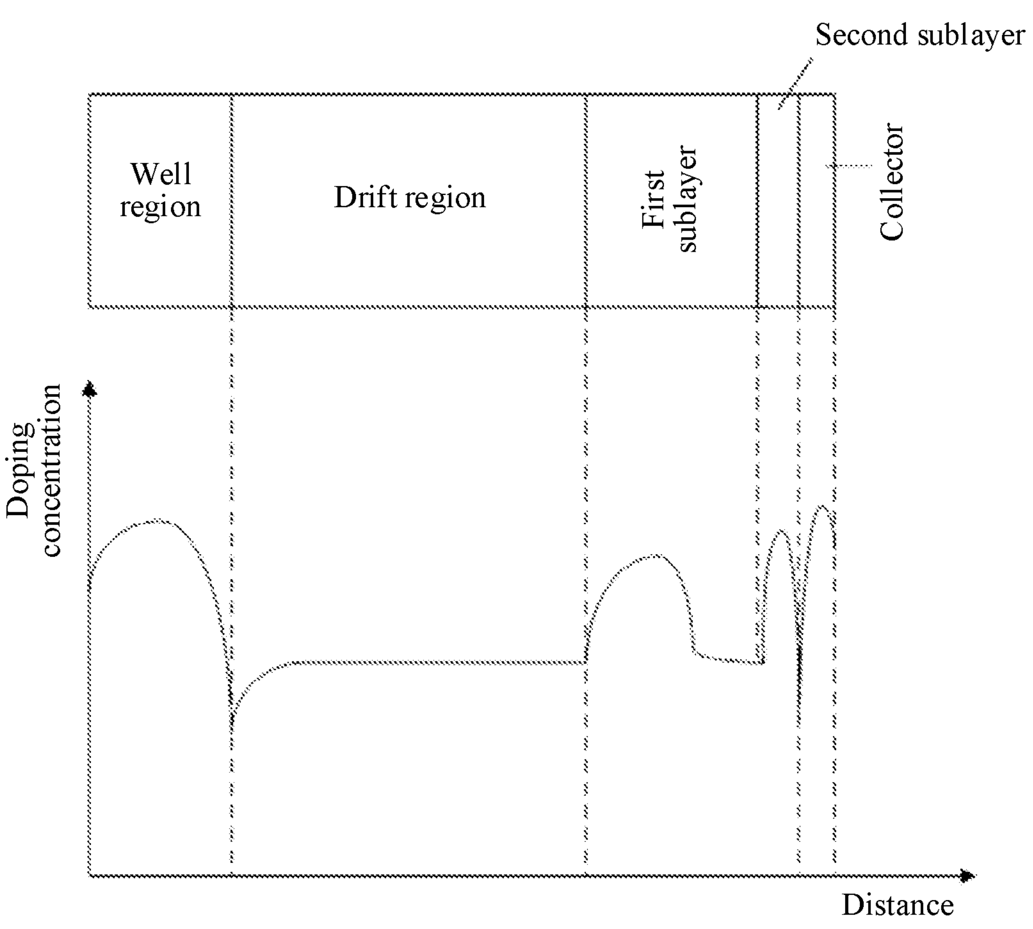
FIG. 9 is a diagram showing a dopant distribution in an electric field stop layer of an insulated gate bipolar transistor of Comparative Example 4.

A dopant distribution in the electric field stop layer of the IGBT in this comparative example is shown in FIG. 9. It can be seen from FIG. 9 that the distributions of the dopant element in the two sublayers are both steep, and the doping concentration of the dopant element in the second sublayer presents a vertical increase at the junction between the first sublayer and the second sublayer, resulting in a discontinuous distribution of the dopant element at the junction between the first sublayer and the second sublayer, affecting the performance of the IGBT.

It should be noted that although the doping concentration curves of the two sublayers in FIG. 9 are continuous, the dopant elements at the junction between the two sublayers in actual products are not continuous.

Performance Tests

The IGBTs of Example 1 and Comparative Examples 1-4 were tested for softness and reverse turn-off performance respectively. The test results are as follows:

The comparison between Example 1 and Comparative Example 1 showed that the IGBT of Example 1 had smaller turn-off voltage spikes, better turn-off softness, and shorter tail current time.

The comparison between Example 1 and Comparative Example 2 showed that the IGBT of Example 1 and the IGBT of Comparative Example 2 had comparable turn-off softness and tail current time, but the costs of the IGBT of Example 1 were significantly lower than those of Comparative Example 2.

The comparison between Example 1 and Comparative Example 3 showed that the IGBT of Example 1 had a smaller turn-off voltage spike, better turn-off softness, lower high-temperature leakage, and shorter tail current time.

The comparison between Example 1 and Comparative Example 4 showed that the IGBT of Example 1 had a smaller turn-off voltage peak value, better power-off softness, and shorter trail current time.

In the description of the present disclosure, orientation or position relationships indicated by the terms such as "above" and "below" are based on orientation or position relationships shown in the accompanying drawings, and are used only for ease of description of the present disclosure, rather than requiring that the present disclosure needs to be constructed and operated in a particular orientation. Therefore, such terms should not be construed as limiting of the present disclosure.

In description of this specification, description of reference terms such as "an embodiment" or "another embodiment", means that specific features, structures, materials, or characteristics described with reference to the embodiment are included in at least one embodiment of the present disclosure. In this specification, exemplary descriptions of the foregoing terms do not necessarily refer to a same embodiment or example. Besides, the specific features, the structures, the materials or the characteristics that are described may be combined in proper manners in any one or more embodiments or examples. In addition, a person skilled in the art may integrate or combine different embodiments or examples described in the specification and features of the different embodiments or examples as long as they are not contradictory to each other. In addition, it is to be noted that, the terms "first" and "second" in this specification are merely used for descriptive purposes but are not to be construed as indicating or implying relative importance or implicitly specifying a number of indicated technical features.

Although the embodiments of the present disclosure have been shown and described above, it can be understood that, the foregoing embodiments are exemplary and should not be understood as limitation to the present disclosure. A person of ordinary skill in the art can make changes, modifications, replacements, or variations to the foregoing embodiments within the scope of the present disclosure.

INDUSTRIAL APPLICABILITY

An insulated gate bipolar transistor with excellent performance can be obtained through the embodiments of the present disclosure, and the insulated gate bipolar transistor obtained by this method has at least one of the following advantages: higher switching softness; good reverse blocking ability; thinner thickness; lower turn-on loss, and lower switching loss; and lower costs. Therefore, the present disclosure has high practicality.

What is claimed is:

1. An insulated gate bipolar transistor, comprising:

a drift region; an electrode structure on one side of the drift region; and an electric field stop layer, wherein the electric field stop layer is arranged on one side of the drift region away from the electrode structure, the electric field stop layer comprises a first sublayer and a second sublayer laminated together over the drift region, the first sublayer is arranged close to the drift region, a junction depth of the first sublayer from a surface of the first sublayer away from the drift region to a surface of the first sublayer near to the drift region is greater than a junction depth of the second sublayer from a surface of the second sublayer away from the first sublayer to a surface of the second sublayer near to the first region, a peak value of a doping concentration of the first sublayer is less than a peak value of a doping concentration of the second sublayer, a slope of a doping concentration curve of the first sublayer is less than a slope of a doping concentration curve of the second sublayer, and the doping concentration curve of the first sublayer and the doping concentration curve of the second sublayer are continuous, wherein the junction depth of the first sublayer from the surface of the first sublayer away from the drift region to the surface of the first sublayer near to the drift region is 10-100 times the junction depth of the second sublayer from the surface of the second sublayer away from the first sublayer to the surface of the second sublayer near to the first region, the peak value of the doping concentration of the first sublayer is on the order of $10^{14}$, the doping concentration of the first sublayer has no more than two peak values, and the peak value of the doping concentration of the second sublayer is on the order of $10^{15}$-$10^{16}$.

2. The insulated gate bipolar transistor according to claim 1, wherein the first sublayer is formed by proton implantation, the second sublayer is formed by ion implantation, and the first sublayer is formed later than the second sublayer.

3. The insulated gate bipolar transistor according to claim 2, wherein the drift region has N-type doping, a protruding portion is arranged on one side of the drift region away from the electric field stop layer, a recessed portion is formed on an outer side of the protruding portion, and the electrode structure comprises:
- a well region, wherein the well region is arranged in the recessed portion, and the well region has P-type doping;
- a source region and a contact region, wherein the source region and the contact region are arranged in the well region, the source region has N-type doping, and the contact region has P-type doping;
- a gate, wherein the gate is arranged on one side of the protruding portion away from the electric field stop layer; and
- a first metal layer, wherein the first metal layer covers the gate, the source region, and the contact region, and an insulating layer is arranged between the gate and the first metal layer and between the gate and the drift region.

4. The insulated gate bipolar transistor according to claim 1, wherein the drift region has N-type doping, a groove is provided on one side of the drift region away from the electric field stop layer, and the electrode structure comprises:
- a gate, wherein the gate is arranged on the side of the drift region away from the electric field stop layer and extends into the groove;
- a well region, wherein the well region is arranged on the side of the drift region away from the electric field stop layer and is arranged around the gate, and the well region has P-type doping;
- a source region, wherein the source region is arranged on one side of the well region away from the drift region and is arranged around the gate, and the source region has N-type doping;
- a contact region, wherein the contact region is arranged on the side of the well region away from the drift region and is arranged on an outer side of the source region, and the contact region has P-type doping; and
- a first metal layer, wherein the first metal layer covers the gate, the source region, and the contact region, and an insulating layer is arranged between the gate and the first metal layer and between the gate and the drift region.

5. The insulated gate bipolar transistor according to claim 4, further comprising:
- a collector, wherein the collector is arranged on one side of the electric field stop layer away from the drift region; and
- a second metal layer, wherein the second metal layer is arranged on one side of the collector away from the electric field stop layer.

6. An electronic device, comprising the insulated gate bipolar transistor according to claim 1.

* * * * *